(12) United States Patent
Loda

(10) Patent No.: US 7,511,967 B2
(45) Date of Patent: Mar. 31, 2009

(54) AVIONICS ENCLOSURE

(75) Inventor: David C. Loda, Bolton, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 11/708,501

(22) Filed: Feb. 20, 2007

(65) Prior Publication Data

US 2008/0198539 A1 Aug. 21, 2008

(51) Int. Cl.
*H01R 12/16* (2006.01)

(52) U.S. Cl. ............... 361/790; 361/95; 361/683; 361/685; 174/50; 174/50.5; 439/214; 439/517

(58) Field of Classification Search ............ 361/790, 361/683, 685, 95; 439/214, 517; 174/50, 174/50.5

See application file for complete search history.

(56) References Cited

U.S. PATENT DOCUMENTS

| | | | | |
|---|---|---|---|---|
| 3,777,474 A * | 12/1973 | Piquerez | ............... | 368/289 |
| 4,657,331 A * | 4/1987 | Coldren | ............... | 439/571 |
| 4,691,265 A * | 9/1987 | Calver et al. | ............... | 361/717 |
| 4,804,208 A * | 2/1989 | Dye | ............... | 285/26 |
| 4,890,497 A * | 1/1990 | Cahill | ............... | 73/708 |
| 5,292,257 A * | 3/1994 | Milan | ............... | 439/214 |
| 6,053,763 A * | 4/2000 | Brennan et al. | ............... | 439/491 |
| 6,462,953 B2 * | 10/2002 | Tong et al. | ............... | 361/732 |
| 6,586,674 B2 * | 7/2003 | Krause et al. | ............... | 174/50.5 |
| 6,686,654 B2 * | 2/2004 | Farrar et al. | ............... | 257/686 |
| 6,905,374 B2 * | 6/2005 | Milan | ............... | 439/752.5 |
| 7,307,834 B2 * | 12/2007 | Jones et al. | ............... | 361/683 |
| 2002/0089820 A1 * | 7/2002 | Abboud | ............... | 361/685 |
| 2002/0090846 A1 * | 7/2002 | Abboud | ............... | 439/76.1 |
| 2002/0123265 A1 * | 9/2002 | Robinson et al. | ............... | 439/517 |
| 2002/0186551 A1 * | 12/2002 | Murowaki et al. | ............... | 361/752 |
| 2002/0197893 A1 * | 12/2002 | Hiroyuki et al. | ............... | 439/76.2 |
| 2003/0007442 A1 * | 1/2003 | Henrichs | ............... | 369/95 |
| 2003/0226355 A1 * | 12/2003 | Simburger | ............... | 60/484 |
| 2006/0033407 A1 * | 2/2006 | Su | ............... | 312/111 |
| 2006/0216965 A1 * | 9/2006 | Yamanashi et al. | ............... | 439/76.1 |

* cited by examiner

*Primary Examiner*—Dean A. Reichard
*Assistant Examiner*—Xiaoliang Chen
(74) *Attorney, Agent, or Firm*—Bachman & LaPointe, P.C.

(57) ABSTRACT

An enclosure for compact computer boards is described that allows a user to easily configure, or reconfigure, a microserver stack using an interchangeable common bus as a data and power backbone. One application requiring robust and rigorous design constraints is use within an aircraft.

12 Claims, 3 Drawing Sheets

AVIONICS ENCLOSURE

BACKGROUND OF THE INVENTION

The invention relates generally to the field of modular computer systems. More specifically, embodiments of the invention relate to an enclosure for modular computer boards.

Products comprised of multiple systems, such as aircraft or elevators, traditionally have individual controllers with sensors that may be used to collect and store operational data for real-time analysis or analysis at a later time or date. However, this data is typically difficult to collect.

A number of single use devices have been employed to collect, store, preprocess, and transport data to a central computer, such as a central maintenance computer, and allow for uploading the data to an external location for analysis. A number of data bus architectures and formats have been developed to support this purpose but are proprietary and are not compatible. A system becomes compromised as expensive and custom data collection solutions are required to interface each component with each other and with a subsystem. These solutions tend to be inflexible in their design and unable to adapt to changing requirements or applications without extensive rework.

Using a microserver architecture allows for managing real-time maintenance, support, and supply chain of any product made up of one or more systems. Microservers may be embedded into a system and function as computer work stations on the product's system controller level. The microservers may use guided or unguided media to couple with other microservers or client counterparts (users). Physical transmission media are typically grouped into guided media, such as copper wire and fiber optics, and unguided media such as radio and lasers.

Microservers offer dual functionality as a webserver/computer workstation and provide a clustered, Internet addressable node that allows for local or remote access. An IP (Internet Protocol) address uniquely identifies the computer that is attached to that network and allows other computers to communicate with it. Each IP address consists of four bytes or octets, for example, 123.10.123.10.

The microserver hosts reconfigurable software that can collect and process data from an associated controller. It may also communicate with other microservers in its cluster or to higher clusters (such as a Portal managed fleet and flight operations managers) using a network such as the Internet.

Using this approach, managing a complex system such as a fleet of aircraft or vehicles may be accomplished using the Internet. Other applications where this may be applied include shipping containers, automobiles, spacecraft, appliances, human medical monitoring, or any other complex product with sensors and subsystems that require maintenance support and monitoring.

To implement a microserver requires an inexpensive, modular computer architecture, and is intended for embedded computing environments where applications depend on reliable data acquisition in extreme environments such as aircraft.

A typical microserver stack may comprise at least one motherboard (CPU) which acts as a controller for the peripheral components, an analog-to-digital converter, digital I/O, and other peripherals. The motherboard is a single board computer since it interfaces with all other PC components. This controller must support the signaling buses used on all additional boards. Other boards are available for GPS receivers, IEEE 802.11 communications and USB controllers. However, a card may perform a stand alone function without requiring a motherboard to control it.

Avionics means aviation electronics and comprises all electronic systems designed for use on an aircraft. This comprises communications, navigation and the display and management of multiple systems and hundreds of systems that are fitted to aircraft to meet individual roles.

Any equipment fitted to aircraft has to meet a series of rigorous design constraints. The aircraft presents electronics with a unique and sometimes highly complex environment. Airworthiness and certification is one of the most costly, time consuming, troublesome and difficult aspects of building any aircraft. As aircraft and aircrew reliance on avionics has increased, it has placed a duty of responsibility on the robustness of these systems.

For microserver use in aircraft applications, special consideration must be made of the operational environment, available real estate and ease of configuration.

SUMMARY OF THE INVENTION

The inventor has discovered that it would be desirable to have an enclosure that allows a user to easily configure, or reconfigure a microserver stack comprised of compact computer boards in an avionics bay of an aircraft. The invention is an enclosure for compact computer boards that includes an interchangeable common bus as a data and power backbone.

One aspect of the invention provides an enclosure for receiving a compact computer board. Enclosures according to this aspect of the invention comprise four sidewalls, the sidewalls coupled together define four corners, a male portion, a female portion, and an inner periphery and an outer periphery, and a plurality of mounting pads projecting from the interior side of the sidewalls for coupling with the computer board, wherein the inner periphery of the female portion is sized in matching correspondence with the male portion outer periphery allowing one enclosure to be stacked on another enclosure.

Another aspect of the enclosure is wherein the mounting pads are flexible.

Another aspect of the enclosure further comprises a groove around the male portion outer periphery for containing a seal, wherein the seal provides an environmental seal between enclosures when stacked together.

Another aspect of the enclosure further comprises at least one data and power bus located on an inner side of a sidewall.

Another aspect of the enclosure is wherein the bus further comprises at least three connectors.

Another aspect of the enclosure is wherein two of the connectors are corresponding male and female connectors.

Another aspect of the enclosure is wherein the third bus connector is for coupling with a computer board.

Another aspect of the enclosure is wherein the male and female bus connectors are positioned to allow for mating engagement between a corresponding bus connector located on another enclosure when two enclosures are stacked together.

Another aspect of the enclosure is a cover. The cover comprising a planar surface corresponding to a polygon defined by the four enclosure sidewalls, and four cover sidewalls having an inner periphery sized in matching correspondence with the enclosure sidewall male portion outer periphery.

Another aspect of the enclosure is a base. The base comprising a planar surface corresponding to a polygon defined by the four enclosure sidewalls, four base sidewalls having an outer periphery sized in matching correspondence with the enclosure sidewall female portion inner periphery, and at least one bus connector that is in matching correspondence with a corresponding enclosure bus connector and is positioned to allow for mating engagement between a corresponding bus connector located on an enclosure when an enclosure is stacked onto the base, wherein the base bus connector allows for connections external to a stack to be made.

The details of one or more embodiments of the invention are set forth in the accompanying drawings and the description below. Other features, objects, and advantages of the invention will be apparent from the description and drawings, and from the claims.

DETAILED DESCRIPTION

Embodiments of the invention will be described with reference to the accompanying drawing figures wherein like numbers represent like elements throughout. Further, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "mounted," "connected," and "coupled" are used broadly and encompass both direct and indirect mounting, connecting, and coupling. Further, "connected" and "coupled" are not restricted to physical or mechanical connections or couplings.

The invention is an enclosure that houses compact computer boards. The enclosure allows for a reconfigurable microserver assembly comprised of compact computer boards to serve as a lightweight data gateway for a product.

A typical stack for an microserver may require one or two motherboard/processor CPU boards, one for collection and formatting information (workstation function), and the other for managing the routing of data either onboard or off board the product (server/router function). This board may have an IP assigned address.

From this basic board, additional boards in enclosures may be coupled to each other to change or optimize the data interface functionality. Peripheral computer boards can reside on either side (on top or below) of the CPU board. This includes boards that would add additional analog or digital I/O ports, such as ARINC (Aeronautical Radio, Incorporated) 429, USB, Ethernet, and others, as well as additional processors, storage, external wireless communications boards, sensors, and others. The hardware interface in conjunction with software flexibility allows for a customizable device at a low cost.

The computer board size may vary depending on the vendor along with its bus structure.

Figure 1:
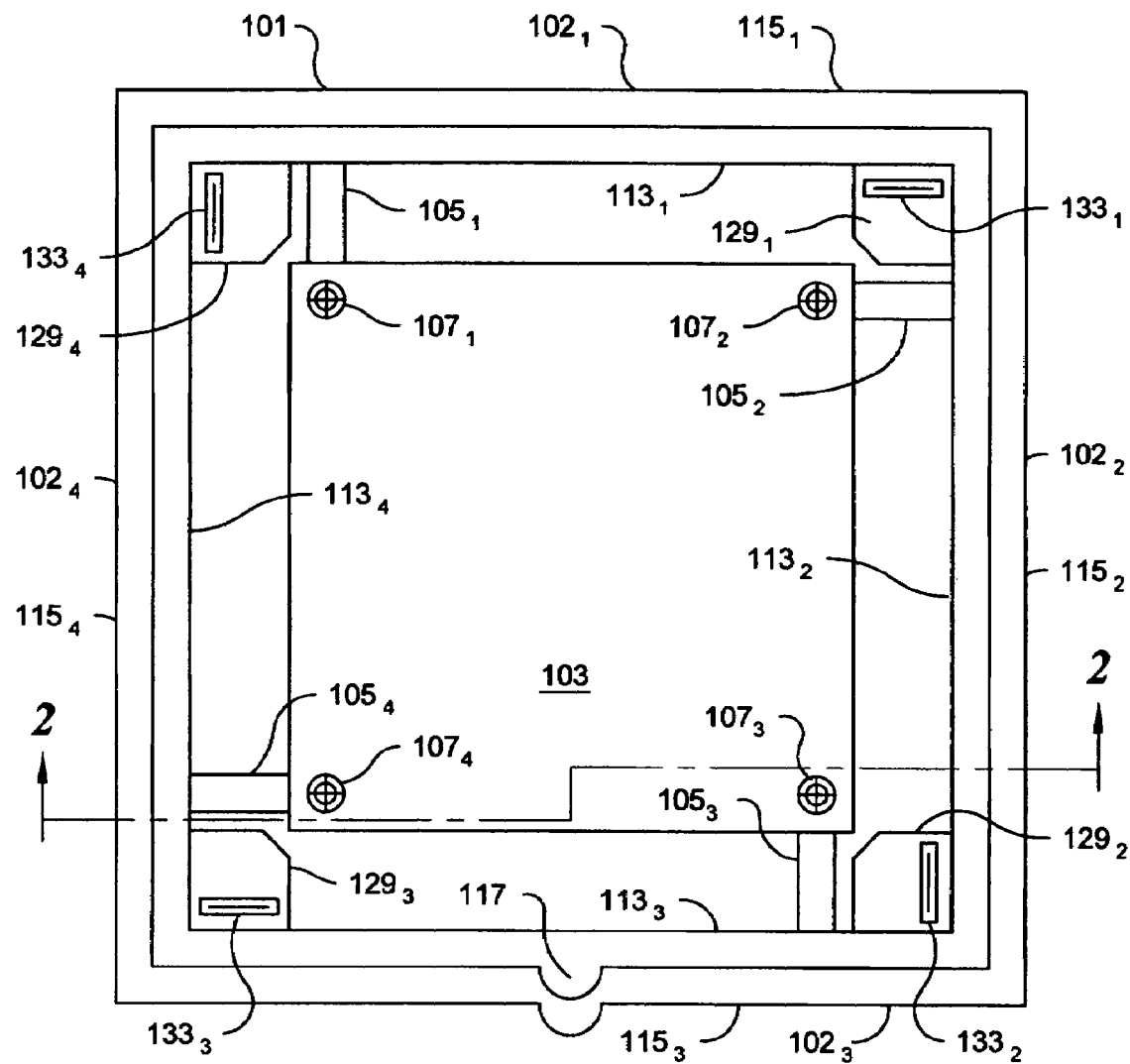
FIG. 1 is an exemplary plan view of an enclosure according to the invention.
Figure 2:
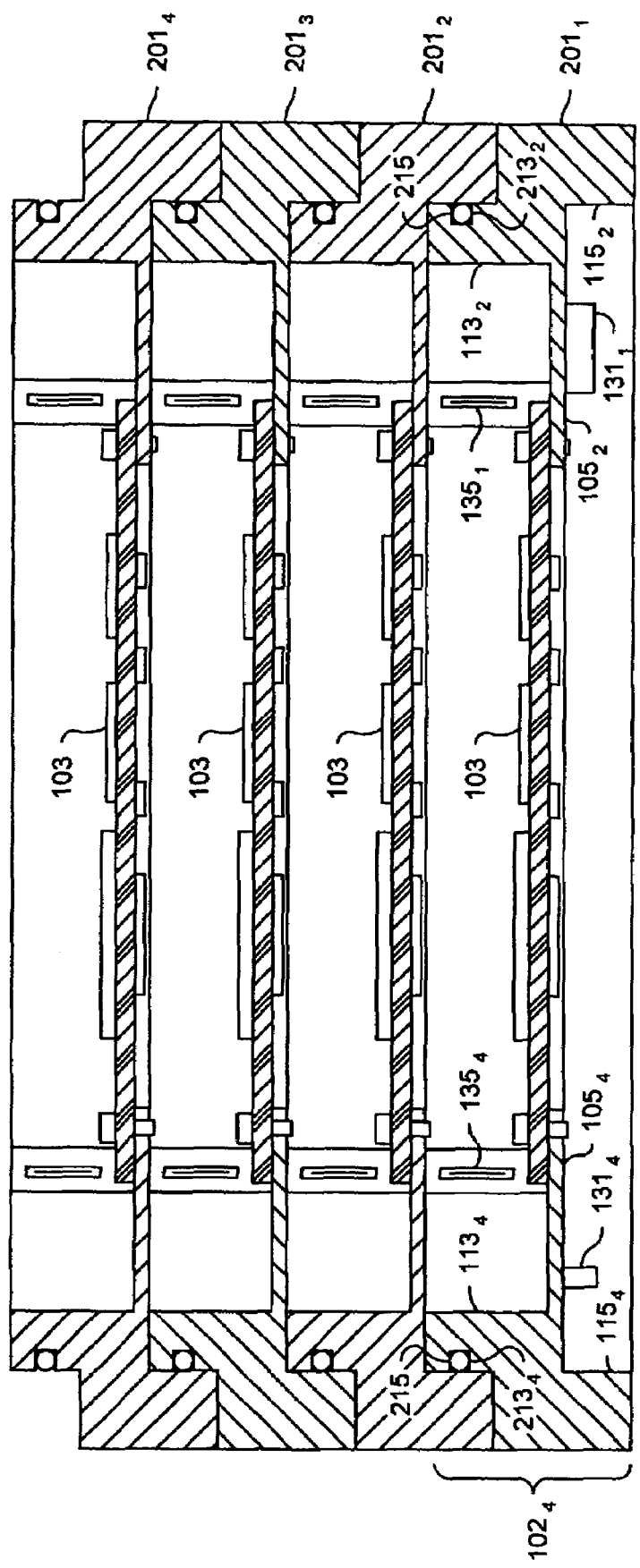
FIG. 2 is a cross sectional view of an exemplary vertical stacking arrangement of four compact computer boards taken along line 2-2 in FIG. 1.
Figure 3:
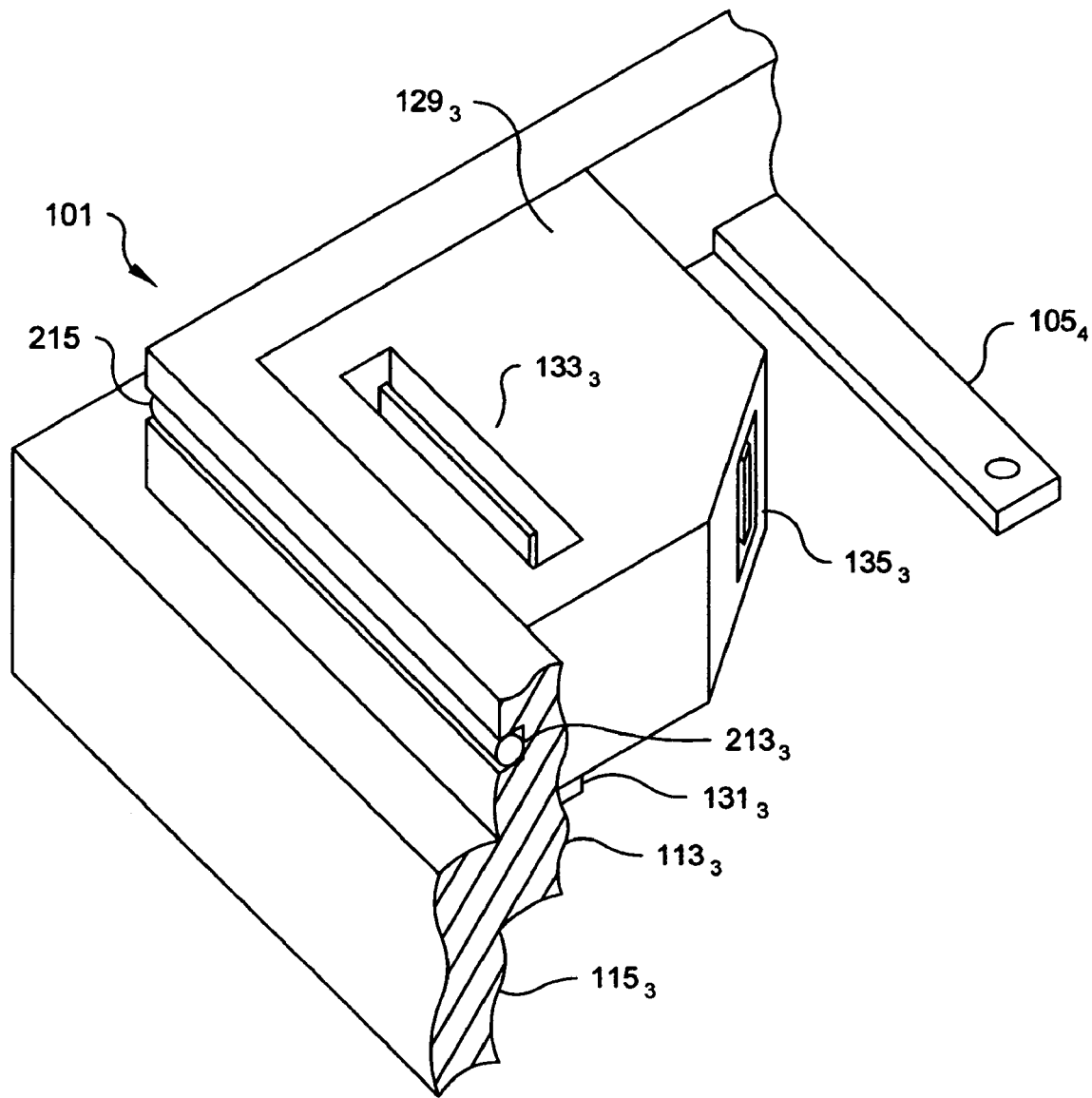
FIG. 3 is an exemplary perspective view of a corner of the enclosure as shown in FIGS. 1 and 2.

The enclosure 101 is shown in FIGS. 1, 2 and 3 in several views. FIG. 1 shows the enclosure 101 holding a compact computer board 103, FIG. 2 shows a cross sectional, stacked view $201_1$, $201_2$, $201_3$, $201_4$, and FIG. 3 shows a cut away of an enclosure corner showing a communication/power bus.

The enclosure 101 includes four sidewalls $102_1$, $102_2$, $102_3$, $102_4$ defining a polygon having an inner periphery sized in conformance with the desired compact computer board 103. The inner periphery may be sized to allow for an internal area around the periphery of a board for external I/O connectors if necessary. The enclosure 101 may be made from an injection molded plastic, or cast from a pourable metal and then machined.

A computer board 103 is placed inside an enclosure 101 onto internal mounting pads $105_1$, $105_2$, $105_3$, $105_4$ that project in from a sidewall. The number and location of mounting pads may be determined by the desired compact computer board, and one or more may project from a sidewall, or none at all. The mounting pads $105_1$, $105_2$, $105_3$, $105_4$ have holes corresponding to board hole locations if screws or pins are used to couple a board 103 to an enclosure 101. The board 103 may be fastened to the flexible mounting pads using four screws $107_1$, $107_2$, $107_3$, $107_4$, or other types of friction fasteners, coupling the board 103 to the enclosure 101 and forming a module. The mounting pads may be made of a flexible, shock-absorbing material to allow the board to undergo a limited amount of deflection in all directions.

Each sidewall $102_1$, $102_2$, $102_3$, $102_4$ has a male portion $113_1$, $113_2$, $113_3$, $113_4$ and a female portion $115_1$, $115_2$, $115_3$, $115_4$. The inner periphery of the female portion $115_1$, $115_2$, $115_3$, $115_4$ is sized in matching correspondence with the outer periphery of the male portion $113_1$, $113_2$, $113_3$, $113_4$. Around the male portion $113_1$, $113_2$, $113_3$, $113_4$ outer periphery is a groove $213_1$, $213_2$, $213_3$, $213_4$ sized to accommodate an environmental seal such as an O-ring 215. The seal 215 provides an environmental seal between two enclosures $201_1$, $201_2$.

Each enclosure 101 may have at least one key 117 allowing for only one orientation when coupling two enclosures together. Enclosures couple relying on friction between opposing enclosure sidewalls and the friction of internal bus connectors. A microserver comprised of a plurality of modules is referred to as a stack.

To allow modules to be placed in any location within a stack, connections are accomplished using at least one integral bus 129. The exemplary embodiment uses four buses $129_1$, $129_2$, $129_3$, $129_4$.

Each bus is configured with at least three connectors. The connectors may be multi-pin, multi-conductor connectors, Ethernet connectors, USB connectors, or any type of connectors capable of supporting a high-speed data link and power distribution. Two of the connectors are corresponding male $131_1$, $131_2$, $131_3$, $131_4$ and female $133_1$, $133_2$, $133_3$, $133_4$ connectors, oriented and positioned to allow module stacking (FIG. 2). The third connector $135_1$, $135_2$, $135_3$, $135_4$ may be of a type different than the stacking connectors. The male $131_1$, $131_2$, $131_3$, $131_4$ and female $133_1$, $133_2$, $133_3$, $133_4$ bus connectors are positioned to allow for mating engagement between a corresponding bus connector located on another enclosure when two enclosures are coupled together. The third connector is used to couple the bus with the associated enclosure computer board via a short cable (not shown) from the board to the bus, terminated with a compatible connector. The short cable allows coupling data and power to and from a board. Other methods of coupling the board to the bus may be employed.

Each enclosure containing a computer board to be stacked is placed on top of a previously mounted enclosure. Stacking requires mating male bus connectors on an upper module with corresponding female connectors on the lower module, and pressing.

To complete a stack, the computer board enclosure uses a base and a cover (not shown). The cover corresponds to a polygon defined by the four enclosure sidewalls and includes four cover sidewalls having an inner periphery sized in conformance with the enclosure sidewall male portion outer periphery. The cover is pressed on top of the last module in a stack. The cover does not require mating bus connectors.

The base comprises a planar surface corresponding to the same polygon defined by the four enclosure sidewalls and includes four base sidewalls having an outer periphery sized in conformance with the enclosure sidewall female portion inner periphery. The base may include flanges located around the base sidewalls for securing the base to a mounting surface. The entire stack rests upon the base. The base further includes mating bus connectors that couple to enclosure bus connectors that allow for connections external to the stack to be made.

One or more embodiments of the present invention have been described. Nevertheless, it will be understood that various modifications may be made without departing from the spirit and scope of the invention. Accordingly, other embodiments are within the scope of the following claims.

What is claimed is:

1. An enclosure for receiving a compact computer board comprising:
    four sidewalls, the sidewalls coupled together define four corners, a male portion, a female portion, and an inner periphery and an outer periphery;
    at least one data and power bus located on an inner side of a sidewall, wherein the at least one data and power bus includes two connectors comprising corresponding male and female connectors and a third connector for coupling with the computer board; and
    a plurality of mounting pads projecting from the interior side of the sidewalls for coupling with the computer board, wherein the inner periphery of the female portion is sized in matching correspondence with the male portion outer periphery allowing one enclosure to be stacked on another enclosure, wherein the female portion and male portion of each sidewall frictionally engage each other allowing one enclosure to be stacked on another enclosure, wherein the two connectors comprising corresponding male and female connectors frictionally engage each other allowing one enclosure to be stacked on another enclosure.

2. The enclosure according to claim 1 wherein the mounting pads are flexible.

3. The enclosure according to claim 2 further comprising a groove around the male portion outer periphery for containing a seal, wherein the seal provides an environmental seal between enclosures when stacked together.

4. The enclosure according to claim 1 wherein the male and female bus connectors are positioned to allow for mating engagement between a corresponding bus connector located on another enclosure when two enclosures are stacked together.

5. The enclosure according to claim 4 further comprising a cover, the cover comprising:
    a planar surface corresponding to a polygon defined by the four enclosure sidewalls; and
    four cover sidewalls having an inner periphery sized in matching correspondence with the enclosure sidewall male portion outer periphery.

6. The enclosure according to claim 5 further comprising a base, the base comprising:
    a planar surface corresponding to a polygon defined by the four enclosure sidewalls;
    four base sidewalls having an outer periphery sized in matching correspondence with the enclosure sidewall female portion inner periphery; and
    at least one bus connector that is in matching correspondence with a corresponding enclosure bus connector and is positioned to allow for mating engagement between a corresponding bus connector located on an enclosure when an enclosure is stacked onto the base, wherein the base bus connector allows for connections external to a stack to be made.

7. An enclosure for receiving a compact computer board comprising:
    at least three sidewalls, the sidewalls coupled together define corners, a male portion and a female portion, and an inner periphery and an outer periphery;
    at least one data and power bus located on an inner side of a sidewall, wherein the data and power bus includes two connectors comprising corresponding male and female connectors and a third connector for coupling with the computer board; and
    a plurality of mounting pads projecting from the interior side of the sidewalls for coupling with the computer board, wherein the inner periphery of the female portion is sized in matching correspondence with the male portion outer periphery allowing one enclosure to be stacked on another enclosure, wherein the female portion and male portion of each sidewall frictionally engage each other allowing one enclosure to be stacked on another enclosure, wherein the two connectors comprising corresponding male and female connectors frictionally engage each other allowing one enclosure to be stacked on another enclosure.

8. The enclosure according to claim 7 wherein the mounting pads are flexible.

9. The enclosure according to claim 8 further comprising a groove around the male portion outer periphery for containing a seal, wherein the seal provides an environmental seal between enclosures when stacked together.

10. The enclosure according to claim 7 wherein the male and female bus connectors are positioned to allow for mating engagement between a corresponding bus connector located on another enclosure when two enclosures are stacked together.

11. The enclosure according to claim 10 further comprising a cover, the cover comprising:
    a planar surface corresponding to a polygon defined by the sidewalls; and
    cover sidewalls having an inner periphery sized in matching correspondence with the enclosure sidewall male portion outer periphery.

12. The enclosure according to claim 11 further comprising a base, the base comprising:
    a planar surface corresponding to a polygon defined by the four enclosure sidewalls;
    base sidewalls having an outer periphery sized in matching correspondence with the enclosure sidewall female portion inner periphery; and
    at least one bus connector that is in matching correspondence with a corresponding enclosure bus connector and is positioned to allow for mating engagement between a corresponding bus connector located on an enclosure when an enclosure is stacked onto the base, wherein the base bus connector allows for connections external to a stack to be made.

* * * * *